United States Patent [19]

Crouch et al.

[11] Patent Number: 5,717,700
[45] Date of Patent: Feb. 10, 1998

[54] METHOD FOR CREATING A HIGH SPEED SCAN-INTERCONNECTED SET OF FLIP-FLOP ELEMENTS IN AN INTEGRATED CIRCUIT TO ENABLE FASTER SCAN-BASED TESTING

[75] Inventors: Alfred L. Crouch; Bernard J. Pappert; Matthew D. Pressly, all of Austin, Tex.

[73] Assignee: Motorola, Inc., Schaumburg, Ill.

[21] Appl. No.: 566,812

[22] Filed: Dec. 4, 1995

[51] Int. Cl.⁶ .................................................. G01R 31/28
[52] U.S. Cl. ..................................................... 371/22.3
[58] Field of Search ............................... 371/22.3, 22.1; 326/9, 16

[56] References Cited

U.S. PATENT DOCUMENTS 4,879,718  11/1989  Sanner ................................ 371/22.3

*Primary Examiner*—Hoa T. Nguyen
*Attorney, Agent, or Firm*—Keith E. Witek

[57] ABSTRACT

The present invention relates to a method (150) of construction of a scannable integrated circuit. The method includes forming a plurality of flip-flops on an integrated circuit where each flip-flop includes a system data transfer gate and a scan data transfer gate, the gates receiving control signals from a controller (152). A clock signal is routed to the flip-flops (154). Preferably, the flip-flops are placed in a manner to optimize the operation of the integrated circuit when in a system mode. The flip-flops are then coupled into scan chains such that the integrated circuit may operate at a scan mode frequency that is equal to or greater than a system mode frequency (156, 158, 160). An alternative method includes forming a plurality of input lines, a plurality of output lines, and a plurality of scan data paths such that each input line starts a balanced scan chain.

33 Claims, 8 Drawing Sheets

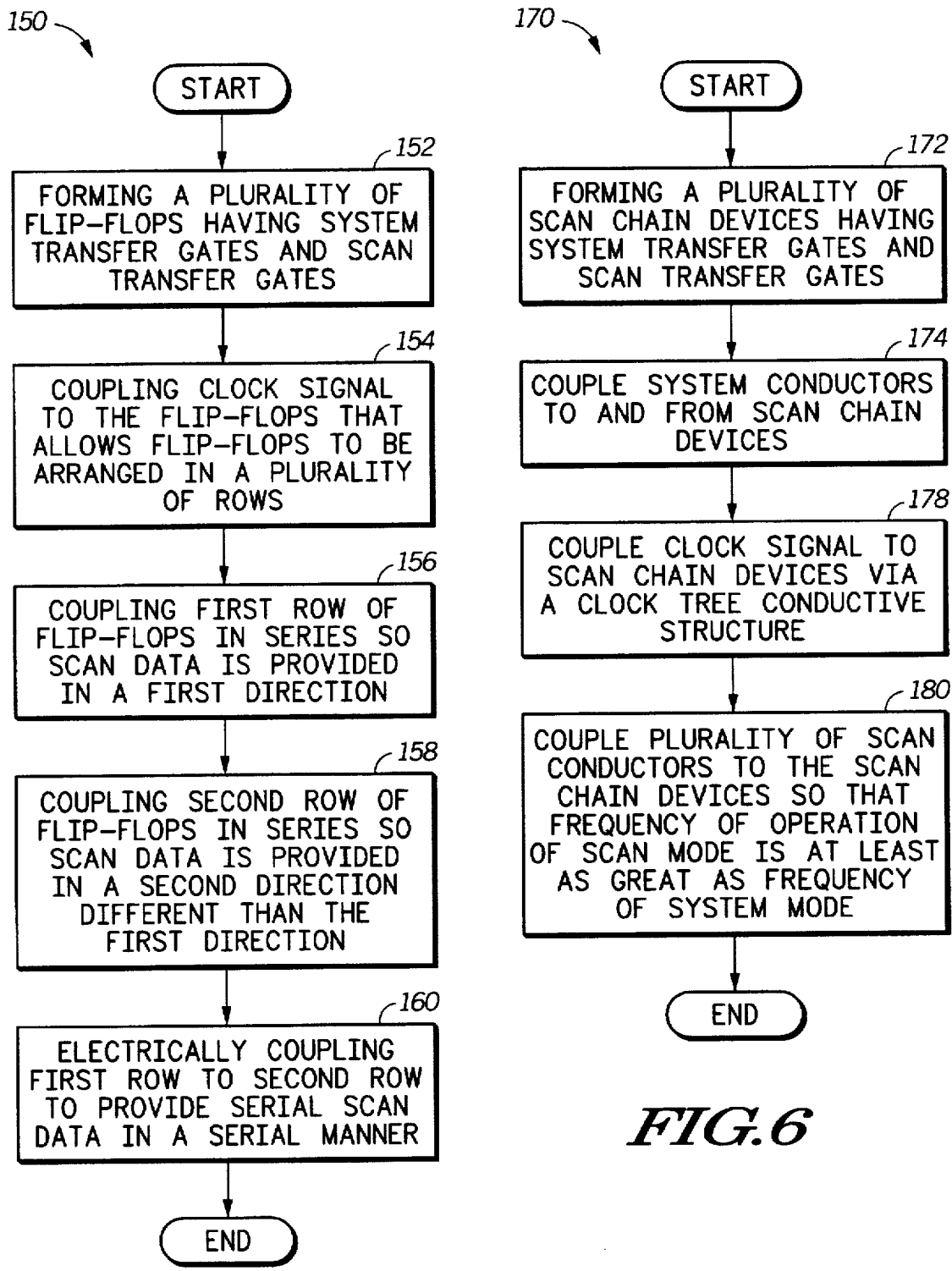

METHOD FOR CREATING A HIGH SPEED SCAN-INTERCONNECTED SET OF FLIP-FLOP ELEMENTS IN AN INTEGRATED CIRCUIT TO ENABLE FASTER SCAN-BASED TESTING

TECHNICAL FIELD OF THE INVENTION

This invention relates generally to integrated circuitry and more particularly to a scannable integrated circuit.

BACKGROUND OF THE INVENTION

The complexity of modern integrated circuitry (ICs) continues to increase at an dramatic rate. Modern integrated circuits include millions of transistors contained on a single substrate. In order to create the millions of transistors on the substrate, the size of each transistor has decreased dramatically. Thus, today, a single integrated circuit takes up less area, operates more quickly, and consumes less power than ever before. However, with the increase in transistor numbers on each integrated circuit, the likelihood that at least one transistor contained on the integrated circuit malfunctions after fabrication also increases. Thus, various testing methods have been developed to verify the operation of integrated circuits after fabrication but prior to sale.

One testing methodology involves providing a certain set of inputs to the integrated circuit over many clock signals, reading the outputs generated by the inputs, and comparing the outputs to expected results. When the outputs fall to correctly compare to the expected results, the integrated circuit has improperly functioned. However, in order to test each particular internal logic portion of the integrated circuit, a huge number of variations in inputs must be provided. When the output is not the correct output when designing the integrated circuit, a diagnostic engineer must still spend a huge amount of time to identify which malfunctioning transistor or set of malfunctioning transistors caused the error. Thus, in modern integrated circuits (ICs), the ability to test internal logic with standard functional or operational vectors is no longer cost efficient. The transistor-to-package pin ratio is typically too large to successfully verify the internal structure of the chip in a reasonable amount of vectors or test time.

For example, if there are 3 million transistors on an IC packed in a 300 pin package, an average of (3,000,000/300) =10,000 transistors must be tested by each pin in a best case. Thus, an the average, at least 10,000 voltage transitions must be applied to each pin in order to test the operation of each transistor in the IC in a best case. Further, many techniques that have been used to test and verify densely packed board designs cannot be used within the operation of the IC because there is no direct access to many of the circuits within the packaged and sealed IC.

As an alternative to prior testing techniques, the test technique of internal embedded scan design has become a cost effective solution to test the operation of ICs. Scan design is accomplished by altering the structure of standard flip-flops and latches (storage elements) within the IC into scan flip-flops and latches by providing a second alternate scan input for scan data parallel to the functional data input. The alternate input for scan data is generally implemented by placing a multiplexor in front of the standard input which selects either scan data or functional data. These "scannable" elements are then connected together in a serial shift register fashion by connecting the output of one element to the scan input of a next element via a "scan chain". The scan chain can load and unload internal IC state information by allowing scan data to be transferred from one element to another on each active clock edge when a scan enable signal is asserted.

The operation of ICs employing scan design may switch from the scan mode to the system mode at any clock cycle. In this fashion, a particular scan data sequence may be loaded into the scannable elements during scan mode, the particular sequence intending to produce a particular logic function outcome from the logic functions in the IC. Once the scan data sequence is loaded, the operation of the IC is switched to system mode for a single clock cycle, and the resulting system data is captured in the scannable elements. The IC is then placed in scan mode and clocked until the data is received at a serial output pin. The received data is then compared to expected results to verify the operation of the logic circuitry for the particular case. In this fashion, the operation of at least a portion of the logic circuitry in the IC may be verified even though this portion of the logic circuitry is internal to the IC and difficult to access directly via external pins of the IC.

By selectively loading scan data and varying clocking frequencies, the technique of providing scan data in scan mode and switching to system mode for a single clock cycle may be employed to determine the delay of portions of the logic circuitry in the IC. Scan data is first provided to the scan elements in the scan chain such that specific scan elements contain predetermined values. The predetermined values in the scan elements are selected so that specific results will be produced by the logic circuits receiving output from the scan elements and produced in connected scan elements. The predetermined values are selected so that the results produced in the connected scan elements differ from the values provided during scan mode. Thus, if the logic circuit functions properly, the data produced by the logic circuits will alter the values in the connected scan elements. However, if the logic circuits do not function within the clock period, the values in the respective scan elements will not change. Thus, by varying the scan data provided to the scan chain and also the frequency of operation, the inherent delay of particular logic circuits may be verified.

Thus, the scan design has the effect of turning each selected sequential scan device (flip-flop or latch) into an internal test point. In a typical scannable device, or for a flip-flop, the standard input is referred to as the D-input while the standard output is referred to as the Q-output. Thus, the D-input of each scannable device is a direct observable point, or primary output test point. Further, the Q-output or equivalent pin (such as Q) of each scannable device becomes a direct control point, or primary input test point.

As one skilled in the art will readily appreciate, not every storage element must be converted to a scan element to provide benefits through scanning. If all elements are convened, then the design is known as a full-scan architecture. However, if only selected storage elements are convened, then the design is known as a partial-scan architecture. If either full-scan or partial-scan is supported, the economics of testing improve. A scan architecture of any type allows each scanned sequential device to be viewed as if it were a package pin which reduces the gate/transistor-to-pin ratio (for example 3 million transistors in a 300 pin package with 10,000 scannable sequential elements has a figure of merit of 291 transistors per pin). Since the logic functions are more accessible, an IC incorporating a scan architecture requires fewer test vectors and less test time. A reduction in testing time results in a reduction in per device cost of manufacturing the IC.

The cost of testing an IC is one of the two largest recurring economic costs in IC design, with the cost of silicon being the other. Because of the tradeoff between "cost of test" and "cost of silicon", scan design is not universally accepted by all design organizations. The use of scan flip-flops instead of the smaller non-scanned flip-flops requires more silicon space and therefore increases the cost of silicon. Further, the routing of the scan chain adds wire connections and interconnection routing to the design which also increases silicon area.

Compared to non-scan flip-flops, prior art scan flip-flops had an associated performance penalty. The performance penalty resulted from the additional delay caused by a multiplexor that was required to multiplex the D-input pin of the scan flip-flop with the scan data input pin (SDI-input) of the scan flip-flop. As one skilled in the art is constructed will readily appreciate, such multiplexing required an additional three gates in series to accomplish the multiplexing. The multiplexor increased the transit delay time of system data passing between scan flip-flops and ultimately reduced the maximum frequency of operation of the IC during system mode. In some cases this meant that a pan that would otherwise run at, for example, 100 MHz without scan test features could now only run at 92 MHz due to the added scan features. In another form, in order to make up for the performance penalty, larger drive cells were used to minimize the propagation delay penalty. However, these larger drive cells also incurred a silicon area penalty. Therefore, a new scan flip-flop is required to reduce these problems.

In one prior art implementation of the scan flip-flop, a multiplexor resides at the D pin input to the flip-flop. Scan data and system data is multiplexed through the multiplexor and provided to the flip-flop. In the scan mode, the multiplexor allowed scan data to pass from one flip-flop to another flip-flop within a scanned chain. However, in the system data mode of operation, system data is provided through the particular logic network leading to the multiplexor. The inclusion of the multiplexor on the input side of the flip-flop increases the physical size of the scan flip-flop. Further, the logic circuitry required to implement the multiplexing construction from the scan flip-flop adds additional delay time to the propagation signals through the combination of the multiplexor and scan flip-flop. Thus, the frequency of operation of devices incorporating the particular flip-flop structure having multiplexors at the input is decreased due to the additional overhead of the multiplexor. This delay is not acceptable to most high speed, market competitive microprocessors.

One particular methodology for providing a scan architecture within an IC that did not reduce the performance of the IC during system mode is implemented by International Business Machines (IBM) and is referred to as the level sensitive scan design (LSSD). In the LSSD architecture, a plurality of clocks are provided to each of the scan flip-flops. The scan flip-flops are separated into scan latches wherein each scan flip-flop comprises both a master and a slave latch. The plurality of clock signals are provided separately to the master and slave latches so that data may be provided to each during differing modes of operation. During a system mode of operation of the LSSD architecture, system data is provided to the master latch and the master latch is clocked to receive the data with a master clock signal. Further, during the system operation of the LSSD architecture, a system slave clock causes the system slave latches to receive the system data.

During a scan mode of operation of the ICs containing the LSSD scan architecture, a scan slave clock is used to operate a plurality of scan slave latches that are operably connected to the master latches to receive data only during the scan mode. In effect, a third latching element is added to the existing master and slave latches which comprises a complete scan element. Because of this third latching element, the LSSD scan architecture consumes a significant mount of substrate surface area.

Further, in order to increase the speed of operation of the IC during system mode, the LSSD architecture often grouped the placement of the scan slave latches (third latching element) in a group away from the master latches and system slave latches. Thus, the length of the lines connecting the scan slave latches to the respective and subsequent master latch were great after placement and routing of the IC design. Due to the great length of the signal paths that the scan data had to transverse, the frequency of operation of an IC incorporating the LSSD architecture during scan mode was typically a small fraction of the frequency of operation of the IC incorporating the LSSD architecture during system mode. Thus, the scan mode could not be used to directly verify the operation of the logic circuits within the IC at various clocking frequencies.

Thus, there exists a need in the an for scan elements that do not limit the frequency of operation of the associated IC (improved scan routing is needed) and a need in the an for a method of construction of individual scan circuits and flip-flops that facilitates the verification of an integrated circuit in a more time efficient manner.

BRIEF DESCRIPTION OF THE DRAWINGS

FIG. 5 is a logic diagram illustrating a method for making a scannable integrated circuit in accordance with the principle of the present invention;

FIG. 6 is a logic diagram illustrating an alternative method for making an integrated circuit in accordance with the present invention;

DETAILED DESCRIPTION OF THE DRAWINGS

The present invention relates to an apparatus and method for providing scan data to a latch portion of a storage data element. Further, the invention relates to a storage element incorporating such teachings. The apparatus preferably includes a plurality of data transfer gates that provide data to a master portion of a flip-flop. The data transfer gates minimize the set-up time required for data entering the data storage element. Because the set-up have been reduced, both system data have been reduced, both system data and scan data are received by the storage element in an optimized manner. The design of scan chains incorporating the data storage elements are also optimized in accordance with the present invention to reduce scan testing times required to verify the operation of the IC in which the scan chain is installed. Further, due to its increased speed of operation, the structure of the present invention increased verification capabilities. In order to reduce the silicon area penalty and performance penalty associated with the scan design, the scan design must be optimized. Routing of signals between scan elements must be optimized by constructing a scan chain wherein each scan element in a scan chain is its nearest neighbor on the silicon. Thus, the scan chain path lengths are reduced as well as the associated cost. However, when the length of the scan chain between adjacent scan elements in the scan chain is too short, scan data may transmit to a next scan element before the system clock has transitioned, thus incorrectly "smearing" data through the scan chain and invalidating results.

Figure 1:
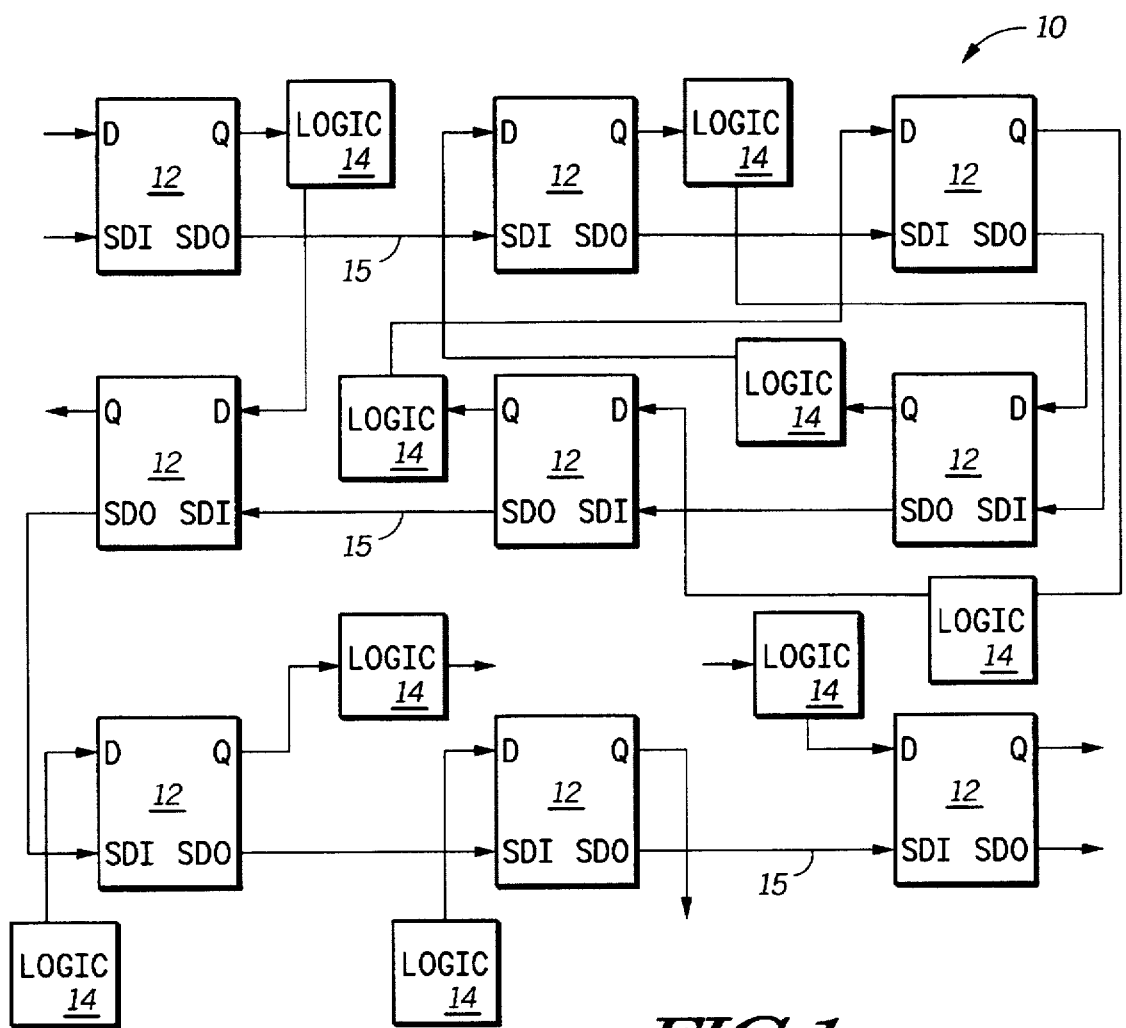
FIG. 1 is a block diagram illustrating a scan path architecture after first optimizing the functional paths in a place and route tool and subsequently adding the scan paths in accordance with the teachings of the present invention.

FIG. 1 illustrates an integrated circuit 10 including a plurality of scannable scan flip-flops 12 in a scan chain. In FIG. 1, the D flip-flops are scan flip-flops that are placed and routed in a place and route tool and optimized to ensure that the D-to-Q functional connections are operating at maximal performance and speed. This optimization is done without the inclusion of scan paths (SDI/SDO paths) since scan path optimization simultaneous with functional path optimization results in both the scan path and functional path being less than optimal. Once the functional paths are optimized without scan paths and the D flip-flop positions are set via the functional optimization of the IC, the scan connections are inserted in a raster-scan or row column manner. This subsequent insertion of scan lines between close D flip-flops after functional optimization allows functional units or modules within the IC to have, for example, 100 MHz normal operation and at speed>=100 MHz scan operation. In some cases, buffer or drivers need to be added in the scan path between devices or modules in the IC to further speed the scan path. In other words, functional connections are optimized first and then scan is inserted in a rastered manner so that both scan and functional operation are maximized in speed and efficiency.

In FIG. 1, the plurality of scan flip-flops 12 receive system data at their D-input and provide output at their Q-output in a functional/normal mode of operation. Each of the scan flip-flops 12 receives its input through a unique logic function 14. The logic functions 14 provide for the logical operation of the integrated circuit 10 via interconnected logic gates such as AND, NAND, inverter, OR, NOR, transistors, and like logic devices. Each of the scan flip-flops 12 also receives scan data at scan data input port (SDI) and provides scan data at a scan data output port (SDO). As one skilled in the art will readily appreciate, during a "scan mode" of operation of the integrated circuit, serial scan data is provided to each of the scan flip-flops 12 through scan data paths 15 as is illustrated. However, during a "system mode" of operation or "normal mode" of operation, the flip-flops receive data at their D-inputs via the logic functions 14.

Each clock cycle within the integrated circuit 10, when in a "scan mode", allows the serial scan data to proceed serially from one scan flip-flop 12 to the next scan flip-flop 12 in the scan data chain. In this fashion, scan data may be sequentially loaded to a first scan flip-flop 12 in the chain and provide throughout each scan flip-flop 12 in the chain until the serial scan data is provided as an output at has last scan flip-flop 12 in the chain. When in the scan mode, the basic operation of each of the scan flip-flops 12 in the scan data chain may be verified. The scan data chain may further be used to test the correctness of operation of each the logic circuits 14. By selectively loading a particular serial scan data sequence of logical 1's and 0's and shifting from the scan mode of operation and the system mode of operation, the logical operation of a particular logic function 14 may be verified by one or more clock cycles. As one skilled in the art will readily appreciate, such a scan data structure as is disclosed in FIG. 1 may be used to verify the logical operation of the integrated circuit 10.

When the scan enable signal is deasserted, the scannable elements operate in a "system mode". In system mode, the scannable elements 12 capture system data at their D-inputs at each clock cycle. Standard logic circuitry 14 provides the system data to each scannable element and facilitates the logical operation of the IC. As one skilled in the art will readily appreciate, the input of a particular scannable element 12 will be provided by a particular logic function 14, the logic function 14 receiving as inputs the outputs of various scannable elements (Q-outputs) as well as system inputs. The logic function 14 will then perform a combinational logic function on the inputs to produce a logic function output and provide the logic function output as input to the scannable element. FIG. 1 illustrates the row formation of scan lines inserted after functional optimization for maximal scan and functional performance.

Figure 2:
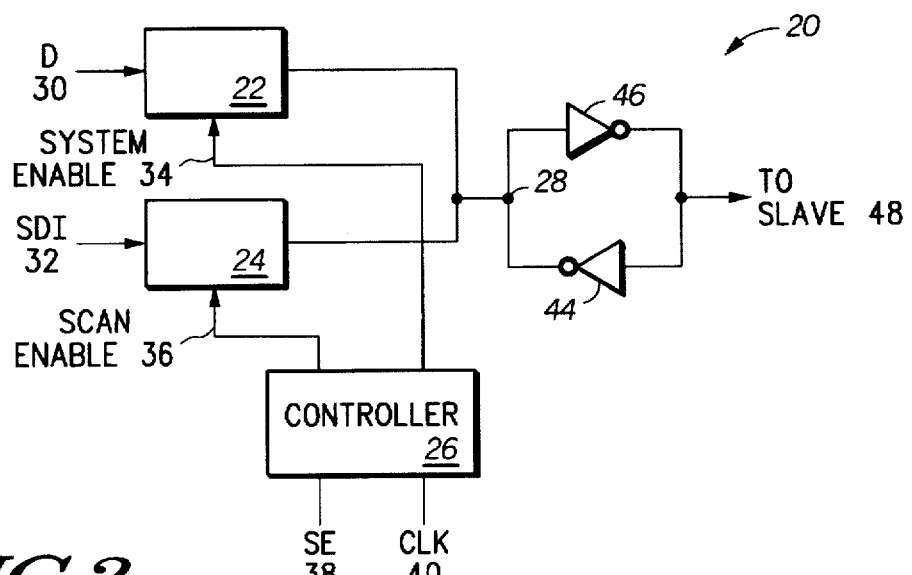
FIG. 2 is a block diagram illustrating an apparatus for providing scan data to a latch portion of a data storage element in accordance with the teachings of the present invention.

FIG. 2 illustrates an apparatus 20 for providing scan data to a master latch portion 42 comprising inverters 44 and 46 wherein the master latch portion is part of a scan data storage element. See FIG. 3 wherein a typical master latch portion 42 comprises some type of circular coupled inverter elements such as elements 44 and 46. Preferably, the data storage element is one of a plurality of data storage elements in a digital circuit, wherein the data storage elements receive data, both system data and scan data, in accordance with the principles described in conjunction with scan chain design of FIG. 1.

The apparatus 20 preferably comprises a system data transfer gate 22, a scan data transfer gate 24, and a controller 26. Each gate 22 or 24 may contain only one logic gate/transistor or may contain a plurality of interconnected logic gates/transistors. The system data transfer gate 22 operably couples to an input 28 of the latch portion 42. The system data transfer gate 22 receives system data (D) 30, and selectively passes the system data (D) 30 to the master latch portion 42 based upon a system data transfer enable signal 34. Preferably, the system data transfer gate 22 comprises a transmission gate (which is a parallel coupled N-channel transistor and a P-channel transistor). However, the system data transfer gate 22 could comprise any circuit element performing a gating function.

The scan data transfer gate 24 operably couples to the input 28 of the latch portion 42. The scan data transfer gate 24 receives scan data input, SDI 32, and selectively passes the scan data to the latch portion 42 based upon a scan data transfer enable signal 36. Preferably, the scan data transfer gate 24 comprises a transmission gate. However, the scan data transfer gate 24 could comprise any circuit element performing a gating function.

The controller 26 operably couples to the system data transfer gate 22 and the scan data transfer gate 24. The controller 26 provides the scan data transfer enable signal 36 to the scan data transfer gate 24 upon receipt of a scan enable signal, SE 38. The controller 26 otherwise provides the system data transfer enable signal 34 to the system data transfer gate 22. Thus, the operation of the controller 26 provides output signals from the system data transfer gate 22 and the scan data transfer gate 24 in a mutually exclusive manner based upon the scan data transfer enable signal 38. Preferably, the controller 26 also receives a clock signal 40 that allows the operation of the apparatus 20 to coincide with the system clock. The controller preferably combinational of combinational digital circuit elements. One skilled in the art will readily appreciate the various circuits that may be employed to perform the requisite functions of the controller 26.

Preferably, the master latch portion 42 comprises a latch as is known in the art, the latch comprising a first inverter 44 operably coupled to a second inverter 46 to provide a latching function. However, the master latch portion 42 could comprise other circuits that also provide a latching function. An output of the latch portion 42 is provided to a slave latch portion 48 not shown in FIG. 2 but otherwise known in the art for master-slave type flip-flops. Other flip-flops and configurations other than a master-slave configurations may also be used herein to store a binary value of data.

Preferably, the apparatus 20 as illustrated in FIG. 2 further includes a multiplexor coupled to the input of the system data transfer gate 22. The multiplexor selectively provides the system data transfer gate 22 with an output of the slave 48 and the system data 30. Therefore, a hold function can be enabled for the master portion 42 and the slave portion 48 wherein the logic output of the slave is retained as the same logic output for many clock cycles. This technique of using a hold function is useful for low power products.

The apparatus 20 illustrated in FIG. 2 provides many important advantages over the prior art. Because the apparatus 20 provides system data D 30 through the system transfer gate 22 and scan data SDI 32 through the scan data transfer gate 24, the requirement of including a multiplexor (with much more delay time) at the input of latch portion 42 is eliminated. The elimination of the multiplexor for multiplexing the system data 30 and the scan data 32 reduces the set-up time associated with the latch portion 42, and also reduces the circuitry needed to selectively provide system data D 30 and scan data SDI 32 to the master latch portion 42. The reduction in circuitry reduces the area required to construct the circuit on a substrate. Further, because the effective length of the circuitry passing the system data D 30 has been reduced for each storage element, the frequency of operation of the integrated circuit in which the present invention is incorporated increases accordingly. Further, because of the reduction in circuitry resulting from the incorporation of the teachings of the present invention, the power consumption of the apparatus 20 is reduced as compared to the prior an circuits performing the same function.

Figure 3:
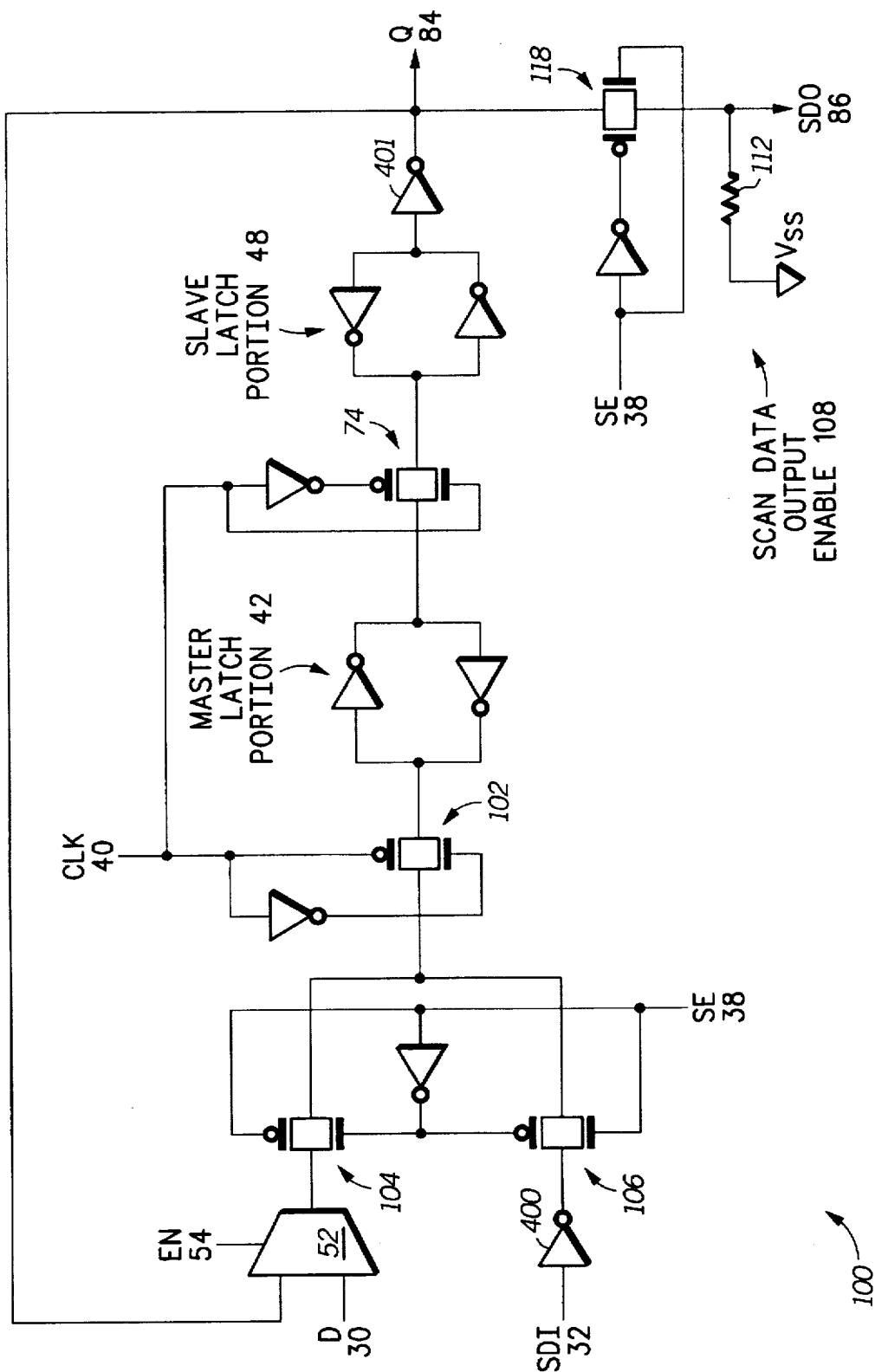
FIG. 3 is a schematic diagram illustrating an alternate storage cell in accordance with the present invention.

FIG. 3 illustrates a storage cell 100 comprising a master latch portion 42, first transfer gate 102, second transfer gate 104, multiplexor 52, and operable coupling 106. The master latch portion 42 preferably has an input and an output as illustrated. The master latch portion 42 preferably comprises a standard latch including two operably coupled inverters. The master latch portion 42 is preferably coupled to a slave latch portion 48 through transfer gate 74. The transfer gate 74 is operated by clock signal 40 to provide the master latch portion contents 42 to the slave latch portion 48 upon a rising edge of the clock 40. The first transfer gate 102 has an input and an output wherein the output is operably coupled to the master latch portion 42. The first transfer gate 102 receives as a first control input the clock signal 40. Thus, the first transfer gate transfers its input to the master latch portion 42 upon a falling edge of the clock 40.

The second transfer gate 104 has an input operably coupled to the output of the multiplexor 52 and an output operably coupled to the input of the first transfer gate 102. The second transfer gate 104 receives as a control input a scan enable signal 38. The second transfer gate 104 receives the scan enable signal 38 such that, on a logic low level of the scan enable signal 38, the second transfer gate 106 conducts to transfer the multiplexor 52 output to the first transfer gate 102 input.

The multiplexor 52 receives two inputs, the system data input (D) 30 and the slave latch portion 48 contents Q 84. The multiplexor 52 is preferably an inverting multiplexor as illustrated in the embodiment of FIG. 3. Further, in order to ensure that the logical polarity is correct and to provide additional current drive or noise reduction, inverters/drivers 400 and 401 are included in FIG. 3 as is known in the art. The multiplexor provides input to the second transfer gate 104 and is operated by MUX enable signal EN 54. During a system data mode of operation, the enable signal EN 54 is preferably logic high so that the system data (D) 30 is passed through the multiplexor 42 to the second transfer gate 104. However, when a hold function is provided to the storage cell 100, the enable signal EN 54 is logic low and the contents of the slave latch portion 48, Q 84, are provided through the multiplexor 52 to the first transfer gate 102 input. It is also important to note that the inverter 400 of FIG. 3 can be made into a clocked inverter (such as that illustrated via element 406 in FIG. 13) to further reduce power consumption.

The operable coupling 106 preferably comprises a transmission gate enabled by the scan enable signal 38. Preferably, the transmission gate 106 is coupled to the scan enable signal 38 such that it conducts on an opposite logic level of the scan enable signal than controls the second transfer gate 104. The transmission gate 106 receives the scan data input 32 as an input and provides the scan data 32 to the input of the first transfer gate 102 when the scan enable signal 38 is logic high.

Preferably, the storage cell 100 further comprises scan data output enabling circuitry 108. The scan data output enabling circuitry 108 provides a scan data output (SDO) 86 from the output of the slave data portion 48 only upon enablement of the scan enable signal SE 38. The scan data output enable circuit 108 preferably comprises a transfer gate 110 operated by the scan enable signal (SE) 38 such that the T-gate 110 conducts when scan enable signal 38 is logic high. However, when the scan data output enable circuit 108 is not provided with a logic high scan enable signal 38, transmission gate 110 is closed. In such a mode, pull down resistor 112 pulls down the scan data output SDO 86 to the $V_{SS}$ level (or ground level) and holds scan data output 86 at that level when the storage cell 100 is not in the scan mode. In this fashion, power is not consumed by the scan data lines due to coupling through either the transmission gate 110 or through coupling effects with other portions of the integrated circuit. When the scan chain is operating in a non-test mode of operation (normal mode of operation), then the SDO line 86 is electrically disconnected from Q 84 via the T-gate 118 so that any capacitance of the SDO line 86 does not load the Q output 84. In addition, due to the coupling of the SDO line 86 to ground (or alternatively $V_{dd}$), when T-gate 118 is open any logic coupled to SDO 86 is not toggling logically and thereby saves power.

Figure 4:
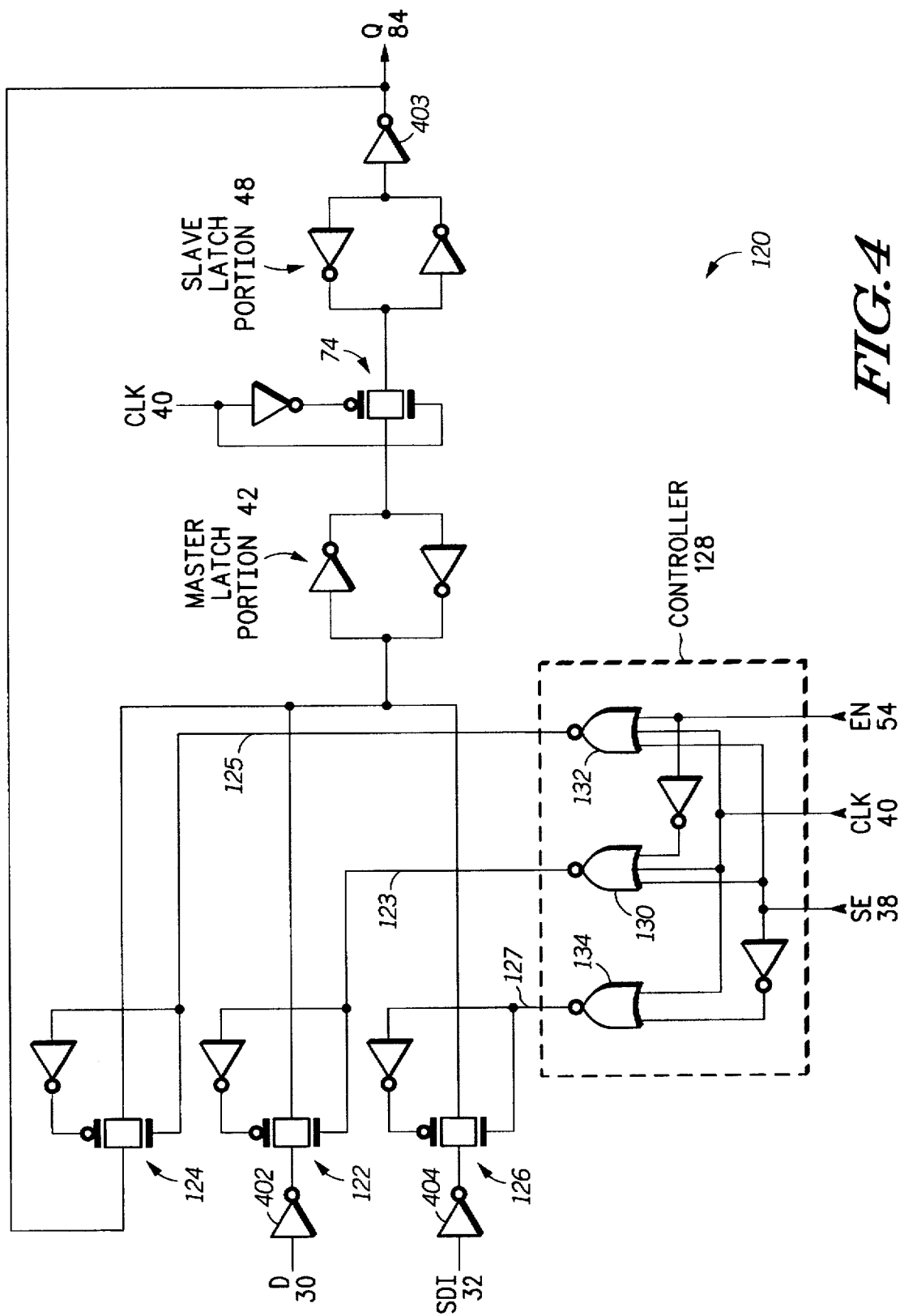
FIG. 4 is a schematic diagram illustrating a storage cell in accordance with the present invention, the storage cell including a hold function.

FIG. 4 illustrates a storage cell 120 comprising a latch portion 42 and 48, first transfer gate 122, second transfer gate 124, third transfer gate 126, and controller 128. The latch portion preferably comprises a master latch portion 42 and a slave latch portion 48. Coupling the master latch portion 42 to the slave latch portion 48 is a transmission gate operated by clock signal 40. As was previously described, the contents of the master latch portion 42 are provided to the latch slave portion 48 upon a rising edge of clock signal 40.

It is important to note that inverters/drivers 402, 403, and 404 are coupled in the FIG. 4 to provide for proper polarity, reduce noise, and/or provide additional current drive.

The first transfer gate 122 includes a first transfer input which receives system data (D) 30.

The first transfer gate 122 has an output operably coupled to the input of the master latch portion. First transfer gate 122 also has a first control input which receives, and is operated by, first control first 123 provided by the controller 128. Preferably, the first transfer gate 122 comprises a T-gate that conducts when the first control signal 123 is logic high. However, the first transfer gate 122 could comprise any various circuitry providing a gating function.

Second transfer gate 124 has an input for receiving an output of the storage cell, signal (Q) 84, an output operably coupled to an input of the master latch portion 42, and a second control input which receives a second control signal 125 from the controller 128. Preferably, the second transfer gate 122 comprises a T-gate that conducts when the second control signal 125 is logic high. However, as with the first transfer gate 122, the second transfer gate 124 could comprise any circuit that provides a gating function.

The third transfer gate 126 has an input for receiving a scan data input signal 32, an output operably coupled to the input of the master latch portion 42, and a third control input for receiving a third control signal 127 from a controller 128. The third transfer gate 126 preferably comprises a T-gate which conducts is controlled by the third control signal 127 and conducts when the third control signal 127 is logic high.

Controller 128 provides the first control signal 123 to the first transfer gate 122 during a first time period. Controller 128 also provides the second control signal 125 to the second transfer gate 124 during a second time period. Finally, the controller 128 provides the third control signal 127 to the third transfer gate 126 during a third time period. The first time period, the second time period, and the third periods of time are non overlapping such that only one of the three signals is at a logic high level during any given time. In this fashion, only one of the three inputs, D 30, SDI 32, or Q 84 may be provided to the input of the master latch portion 42 at any time period during any mode of operation of the storage cell 120.

Preferably, the controller 128 comprises a first NOR gate 130, a second NOR gate 132, and a third NOR gate 134. The first NOR gate 130 receives as inputs the scan enable signal SE 38, an inverted enable signal EN 54, and the clock signal 40. Thus, the first NOR gate 130 produces the first control signal 123 when the SE 38 signal is logic low, the EN 54 signal is logic high, and the clock signal 40 is logic low. This particular situation corresponds to the system mode of operation when the master latch portion 42 is receiving system data D 30 through the first transfer gate 122. This particular mode operation is also referred to as the system mode of operation.

The second NOR gate 132 receives an inverted representation of enable signal 54, the clock signal 40, and the scan enable signal 38 as inputs. The second NOR gate 132 produces the second control signal 125 upon a logic low portion of the clock signal 40 when both the enable signal 54 and the scan enable signal 38 are at a logic low level. In this mode, the master latch portion 42 receives the contents of the slave latch portion 48, signal Q 84 at a logic low level of the clock. This particular mode of operation occurs is often referred to as the "hold mode" of operation or "low power mode" of operation.

The third NOR gate 34 receives as inputs an inverted representation of the scan enable signal 38 and the clock signal 40. Upon a logic high level of the scan enable signal 38 and a logic low level of the clock signal 40, the third NOR gate produces the third control signal 127. The third control signal 127 causes the third transfer gate 126 to conduct. This particular mode of operation is the scan mode of operation. Because the third NOR gate 134 does not receive the EN 54 signal and the first 130 and second 132 NOR gates do receive the SE 38 signal, the third NOR gate 134 has highest priority. Whenever the SE 38 signal is logic high, both the first 130 and second 132 NOR gates produce continuous logic low signals. Thus, the scan mode of operation has the highest priority.

Since some of the enable gates 130–134 are two-input gates and some are three-input gates, delay times though these gates can vary. These gates are balanced by aspect ratio transistor sizing or by buffered delay to ensure that the delay through these three gates 130–134 are nearly the same so that the mutual exclusivity of the control signals 123–127 is preserved to a greater extent. In reality, although the control signal can be made very close to mutually exclusive, a tolerable picosecond or femtosecond overlap of asserted control signals or a tolerable small time period where all three control signals 123–127 are being reasserted may occur.

Thus, the circuit of FIG. 4 allows for the use of simply three transmission gates to provide input to the input of the master latch portion 42. In this fashion, the use of a multiplexor is not required to provide the scan mode of operation. As one skilled in the art will readily appreciate, the construction of the storage cell 120 in accordance with FIG. 4 is often preferable over the use of a circuit having a multiplexor that incurs substantial time delay. In other situations, however, it may be more beneficial to employ the structures illustrated FIGS. 2 or 3 as opposed to structure of FIG. 4 depending upon the design constraints.

FIG. 5 illustrates a method 150 for making a scannable integrated circuit. The method 150 includes as a first step 152 forming a plurality of flip-flops in the scannable integrated circuit. Contained within step 152 is the limitation that at least a portion of the plurality of the flip-flops receive system data via system transfer gates and serial scan data via scan data transfer gates. Preferably, the construction of the system transfer gates and serial scan data transfer gates is in accordance with the structures illustrated in FIG. 2 through FIG. 4. Thus, the method 150 and step 152 require a certain structure providing input to the flip-flops of the scannable integrated circuit.

Next, at step 154, the method includes coupling a clock signal to each of the plurality of flip-flops via a clock tree conductive structure. The clock tree conductive structure preferably distributes the clock signal in a manner which allows flip-flops to be arranged on the integrated circuit in a plurality of rows wherein each row contains a subset of the plurality of flip-flops. Next, at step 156, the method includes coupling each flip-flop in a first row of a plurality of rows in series that the serial scan data is provided to the first row of flip-flops in a serial manner in a first direction. At step 158, the method includes coupling each flip-flop in a second row of a plurality of flip-flops in series such that serial scan data is provided to the second row of flip-flops in a serial manner in a second direction. The second direction is substantially opposite the first direction. Finally, at step 160, the method includes electrically coupling the first row to the second row so that the serial scan data is serially scanned through the first and second row in a serial manner to verify the operation of the flip-flops.

Thus, the method 150 illustrated in FIG. 5 provides the important advantages of having a scannable integrated circuit designed such that scan data is provided to the plurality of flip-flops associated with the integrated circuit in an organized fashion such that the scan data paths are optimized. In this manner, the frequency of operation of the scannable integrated circuit during a scan mode is greater than that of the prior art scannable integrated circuits. Further, the construction of the scannable integrated circuit in accordance with the method 150 illustrated in FIG. 5 reduces the area required to create the circuitry associated with scan portion of the integrated circuit. Finally, the construction of the flip-flops in accordance with the method 150 reduces the delay time associated with each flip-flop thus allowing the integrated circuit to be operated at a higher frequency when in a system mode of operation. Thus, these benefits reduce the cost of the integrated circuit, the size of the integrated circuit, and the power consumption of the integrated circuit while allowing the integrated circuit to operate at a relatively higher frequency.

When interconnecting D flip-flops in steps 156 and 158, the scan data path between each set of serially connected flip-flops is checked for propagation delay. If the propagation delay is too great, then one of two methods may be used to correct the deficiency. In one form, a repeater flip-flop can be added roughly half way into the path to reduce the long delay into two smaller delays. In a second form, a driver circuit may be added to the front to the long path to reduce its time delay.

Preferably, the propagation delay between each flip-flop in the first row is such that the transmission path between adjacent flip-flops in the first row results in a propagation delay having a magnitude less than a period of a clock signal minus the set-up time of the flip-flop but greater than a maximum skew rate of the clock signal. By having the delay period of each of the data paths in the scan chain greater than the maximum skew rate of the clock signal, the design prevents data from passing directly through the master portion of the flip-flop to the slave portion of the flip-flop before the previous contents of the master portion of the flip-flop have been passed to the slave portion of the flip-flop. The erroneous passage of data prematurely to the slave portion is often called "data smearing." Thus, the limitation on the propagation delay of the scan path between flip-flops prevents such data smearing.

Further, by having the scan data path length optimized such that the propagation delay is less than a period of the clock signal minus the set-up time of the flip-flop, it is guaranteed that the frequency of operation of the integrated circuit during scan mode is at least as great as the frequency operation of the integrated circuit during system mode. In this fashion, the scan architecture of the integrated circuit may be used to verify the speed of operation of logic paths within the scannable integrated circuit. By loading a chain of scan data into the flip-flops of the scannable integrated circuit and switching between scan mode and system mode, the operation of logic functions between flip-flops may be tested on a time basis to guarantee their maximum delay time. As one skilled in the art will readily appreciate, by requiring that the scan circuitry of the scannable integrated circuit must operate at a frequency at least as great as the system frequency of operation during a system mode, the ability to scan system to verify the timing of the logic portions is guaranteed.

Preferably, the method 150 also includes providing a clock signal to each of the flip-flops in the scannable integrated circuit through an optimized clock tree conductive structure. The clock tree conductive structure is designed such that each of the flip-flops is provided with a clock signal from a clock tree signal source such that a distance of propagation from the clock signal source to each of the plurality of flip-flops propagates or substantially equal delay path length. In this fashion, skew in the clock signal as it arrives at each of the flip-flops is minimized.

FIG. 6 illustrates a method 170 for making an integrated circuit incorporating the principles of the present invention. At step 172, the method 170 includes forming a plurality of scan chain devices on an integrated circuit. At least a portion of the plurality of scan chain devices receive system data via system transfer gates and serial scan data via scan data transfer gates. The structure of the system transfer gates and scan data transfer gates as well as the flip-flops in which they reside has been previously described with respect to FIGS. 2 through 4.

At step 174, the method includes coupling a plurality of system conductors to the scan chain devices wherein the system conductors communicate system data to and from the scan chain devices when in a system mode of operation. One skilled in the art will readily appreciate that the coupling of scan chain devices to one another includes the incorporation of logical circuits to implement the desired logic functions of the integrated circuit. As was previously described with reference to FIG. 1, the logical circuits coupling the various scan chain devices preferably comprises combinational logic circuit elements. The design and connections of such logical circuitry are known in the art and are not further described herein other than is required to describe the operation of the present invention.

Next, at step 178, the method 170 includes coupling a clock signal to each of the plurality of scan chain devices via a clock tree conductive structure. Preferably, the clock tree conductive structure distributes the clock signal in a manner which allows the scan chain devices to be arranged on the integrated circuit in a plurality of rows. Preferably, each row of the plurality of rows contains a subset of scan chain devices of the plurality of scan chain devices. Further, step 178 preferably includes coupling the clock signal via the clock tree structure such that the clock signal is provided over the clock tree structure from a clock signal source point to each of the plurality of flip-flops over a substantially equal propagation delay path length. The requirement results in a minimum skew clock signal being received by the plurality of scan chain devices.

Next, at step 180, the method 170 includes coupling a plurality of scan conductors to the scan chain devices. The scan conductors communicate scan data to and from the scan chain devices when in the scan mode of operation. A frequency of operation of the scan mode of operation when shifting data into the scan chain devices is greater than or equal to a frequency of operation of a non-scan mode operation. In this fashion, the relatively higher frequency of operation of the scan mode of the integrated circuit allows for reduced testing time of the integrated circuit. Further, the relatively higher frequency of operation of the scan mode of the integrated circuit allows for the scan mode to be used in determining delay times of the logic circuits within the integrated circuit. In a preferred embodiment of the present invention, the scan mode of operation is greater than or equal to 90 MHz. However, the teachings of the present invention are not limited to the 90 MHz frequency level and could easily be applied to integrated circuits operating at much higher frequencies. Thus, to achieve the required delay between scan chain elements, the routing of signals between adjacent scan chain devices must be carefully performed. One skilled in the art will readily appreciate that such routing may be performed with any of the readily available routing tools when provided with the delay requirements.

In a preferred mode of the method 170 of the present invention, no conductors of the second plurality of conductors overlap each other. In this fashion, the wiring of the plurality of scan conductors is more easily optimized according to the criterion described above. It is also preferred that no portion of the clock tree conductive structure overlays any other portion of clock tree conductive structures. With such a limitation, the minimization of the clock skew is more easily accomplished. Further, the requirement of non-overlapping conductors reduces noise as well as complexity in the design of the integrated circuit.

Thus, the method 170 illustrated in FIG. 6 provides the benefits previously discussed with reference to FIG. 5 but also provides the benefits of incorporating a conductive clock tree structure within the integrated circuit. The method 170 also benefits from requiring that the circuit operates in scan mode at a frequency greater than or equal to the frequency of operation in the circuit during a system mode of operation. The benefit realized relates to reduced testing time as well as increased functionality of the scan mode operation of the integrated circuit.

Figure 7:
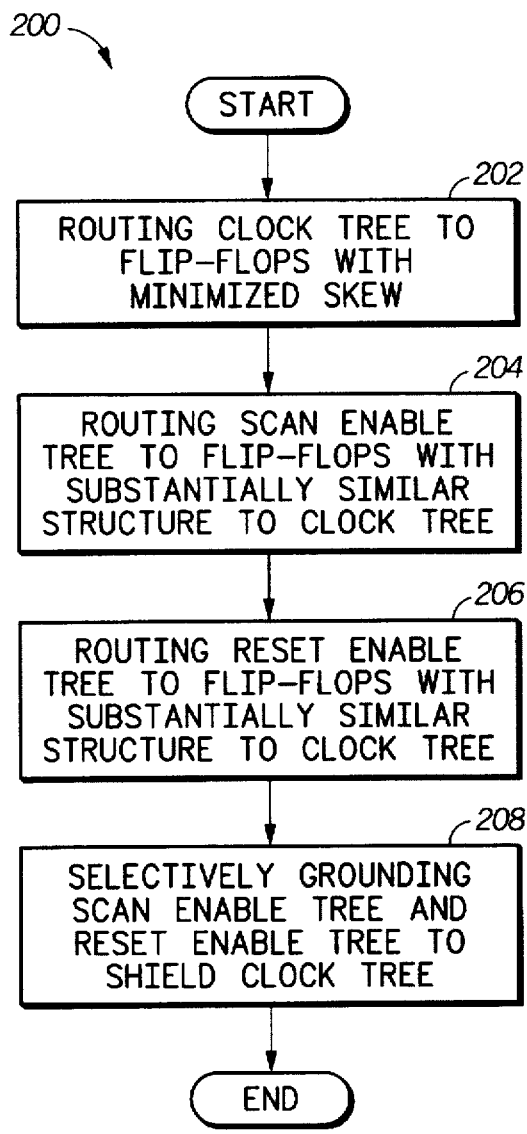
FIG. 7 is a logic diagram illustrating a method for routing signals in a scannable integrated circuit in accordance with the present invention.

FIG. 7 illustrates a method 200 for routing signals in a scannable integrated circuit. The method 200 includes, as a first step 202, routing a clock tree to each flip-flop in a multi flip-flop scan chain formed on the scannable integrated circuit. According to the routing required in step 202, each flip-flop is supplied with a minimized skew clock signal. As was previously described, such is most easily accomplished by causing the propagation length of each path within the clock tree structure from the source to the flip-flop to be substantially equal. As is known in the art, structures such as the "H-tree" structure accomplish such minimization of skew using a relatively simple design methodology. However, the present invention is not limited to the H-tree structure but simply requires that the clock provided to each flip-flop have a minimized skew. A minimum skew clock signal could be provided using various other structures as well.

Next, at step 204, the method 200 includes routing a scan enable tree to each flip-flop. The scan enable tree is substantially identical in structure to the clock tree such the scan enable tree is in close proximity to the clock tree throughout substantial portions of the integrated circuit. As one skilled in the art will readily appreciate, the scan enable tree could have an H-tree structure in one made of construction or operation and various other structures as well.

Next, at step 206, the method 200 includes routing a reset enable tree to each flip-flop wherein the reset enable tree is substantially similar to the clock tree. In this fashion, the scan enable tree is in close proximity to the clock tree throughout substantial portions of the integrated circuit. With the reset enable tree as well, the structure will be similar in design to the clock tree. Therefore, if the clock tree is an H-tree, the reset enable tree will be an H-tree as well. However, the structure of the reset enable tree is not limited to H-tree structures and could take various other forms.

Finally, at step 208, the method 200 includes selectively grounding the scan enable tree and reset enable tree. As one skilled in the art will readily appreciate, grounded lines in close proximity to a signal line provide shielding from noise to the signal line. Thus, the selective grounding of the scan enable tree and the reset enable tree, those structures having a similar structure to the clock tree structure and in close proximity of the clock tree structure, provide the important benefit of shielding the clock tree structure.

As one skilled in the art will further appreciate, the grounding of the scan enable tree and reset enable tree provides great benefits during the system mode of operation of the integrated circuit. Since the system mode of operation of the integrated circuit provides the benchmark for performance of the integrated circuit, by shielding the clock signal using the scan enable lines and reset lines, the integrated circuit may be operated at a higher frequency due to the reduced noise on the system clock. Further, the integrated circuit may be operated at higher temperatures and in noisier environments than the circuit could be integrated without the shielding effect of the closely coupled lines. Thus, the methods of the method 200 of FIG. 7 provide the important benefit of increasing the performance of the related integrated circuit.

Figure 8:
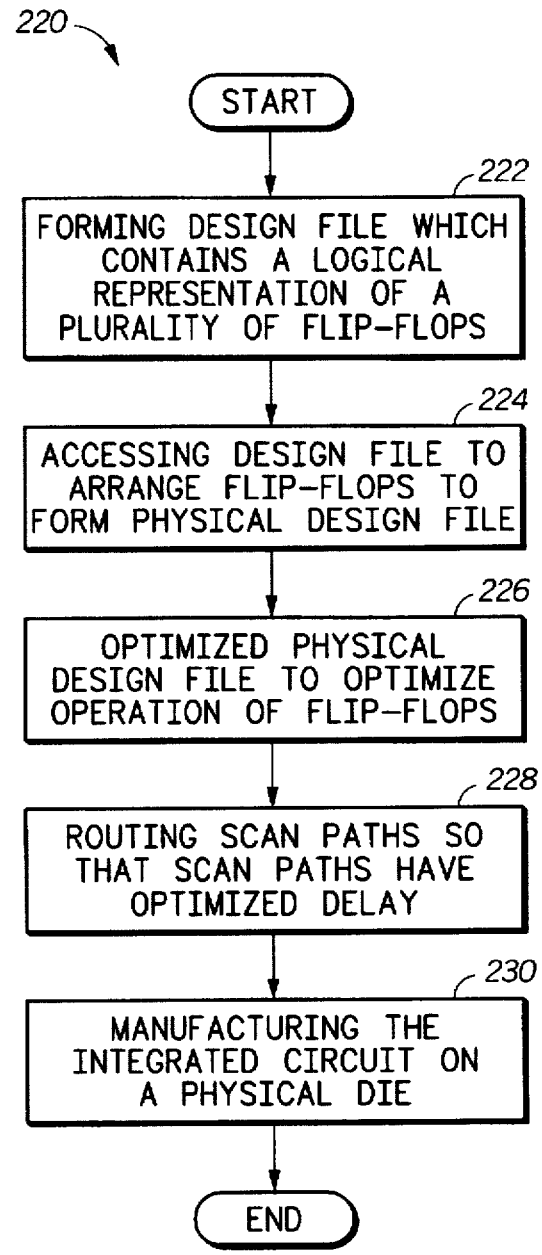
FIG. 8 is a logic diagram illustrating a method for manufacturing a scannable integrated circuit in accordance with the present invention.

FIG. 8 illustrates a method 220 for manufacturing a scannable integrated circuit. The method 220 includes as a first step 222 forming a design file which contains a logical representation of a plurality of flip-flops. The plurality of flip-flops are interconnected through logic gates for forming, at least in part, the functional operational circuitry of the scannable integrated circuit. Next, at step 224, the method includes accessing the design file via a place and route tool. The place and route tool arranges the plurality of flip-flops onto a two-dimensional substrate area to form a physical design file of an integrated circuit die. The integrated circuit die contains a plurality of flip-flops.

Next, at step 226, the method includes optimizing the physical design file so that the flip-flops are placed onto the integrated circuit die. Included in the step is optimizing the physical design file so that the functional operation is optimized as well. During optimization no scan paths are considered. However, the muting of the signals performing the logical functions within the integrated circuit die are optimized so as to maximize the operational frequency of the integrated circuit die.

Next, at step 228, the method includes routing the scan paths between flip-flops in the integrated circuit die after the step of optimizing so that the scan paths can serially shift scan data at a frequency greater than or equal to the frequency of the functional operation optimized by the step of optimizing the physical design file. Step 228 preferably requires that scan paths have a delay less than a period of a system clock minus the set-up time of the flip-flops but greater than a maximum skew rate of the system clock. In this fashion, the design guarantees that no data smearing will occur but also guarantees that a frequency of operation during a scan mode of the integrated circuit manufactured by the method will be at least as great as the frequency of operation of the system mode of the integrated circuit. Finally, at step 230, the method includes manufacturing the integrated circuit onto a physical substrate. Thus, the method 220 illustrated in FIG. 8 produces a scannable integrated circuit in accordance with the principles of the present invention.

The integrated circuit constructed in accordance with the steps of the method 220 includes optimized operation during the system mode of operation and operation during scan mode sufficient to obtain the desired goals.

Figure 9:
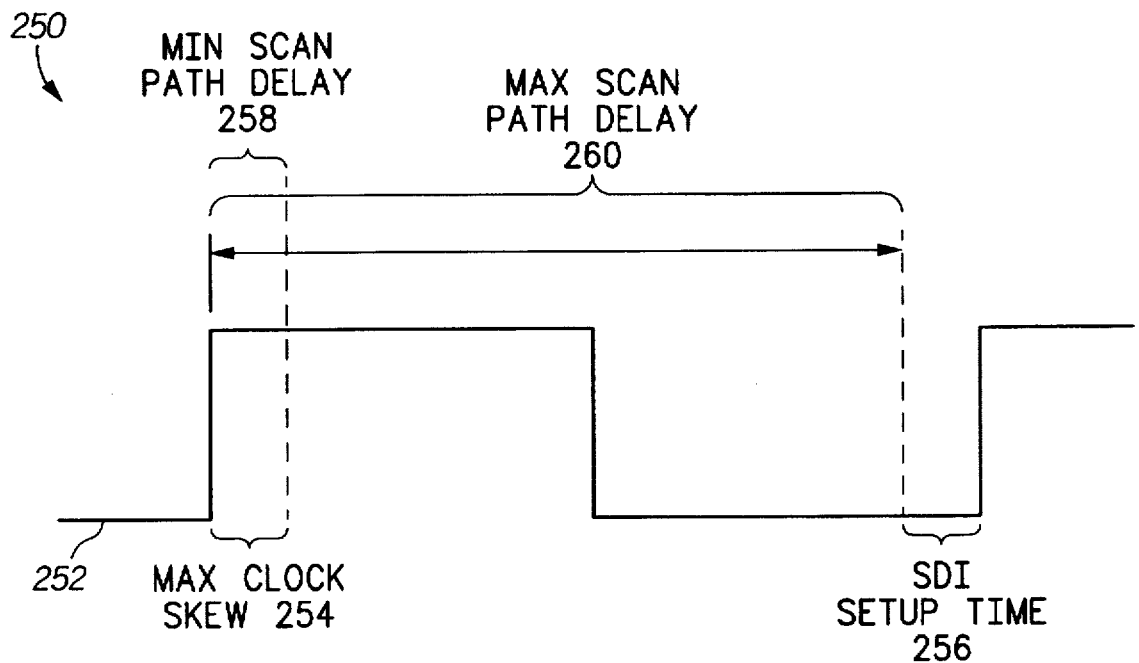
FIG. 9 is a timing diagram illustrating a transit time of a scan path length of a scan data path in accordance with the principles of the present invention.
Figure 10:
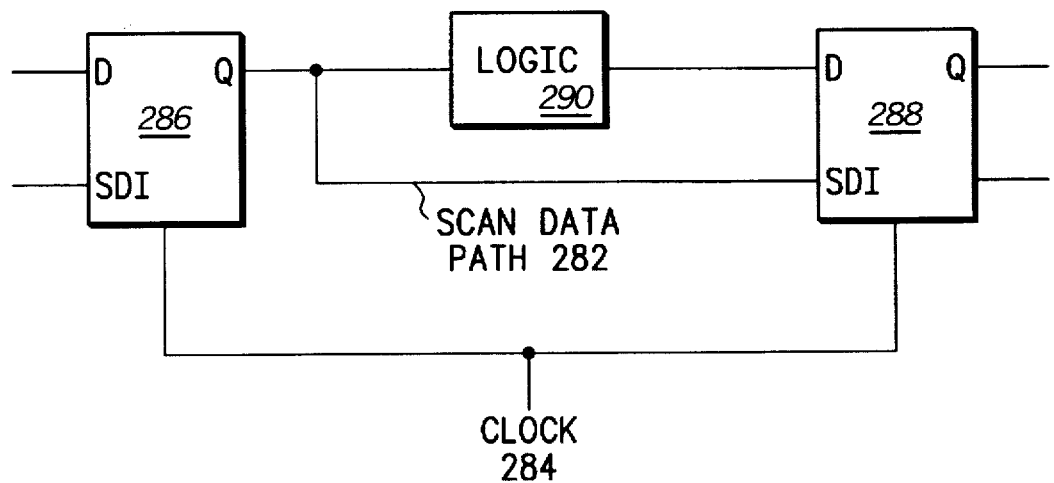
FIG. 10 is a block diagram illustrating the design of a scan path in accordance with the timing requirements of FIG. 10.

FIG. 9 illustrates a timing diagram showing the desired scan path delay with respect to a period of the system clock. FIG. 10 illustrates a block diagram of scan data paths, logic elements, and adjacent flip-flops.

With specific reference to the timing diagram 250 of FIG. 9, a system clock signal 252 has a period inversely proportional to the frequency of the system clock 252. The maximum clock skew rate 254 of the system clock is viewed from the point of the flip-flops receiving system clocking signals. The maximum skew rate 254 of the system clock signal 245 depends upon various factors such as the stability of the clock signal generator, the length of the propagation paths from the clock signal generator and the flip-flops, the relative propagation velocity of the clock signal along various portions of a clock tree structure, the symmetry of the clock tree structure, and various other factors.

With reference to both FIG. 9 and FIG. 10, a scan data path 282 between a first flip-flop 286 and an adjacent flip-flop 288 provides the scan data between the flip-flops. Further, between the flip-flops is logic circuitry represented by 290 that performs a portion of the logic of the integrated circuit in which it resides. The clock signal 252 is provided via clock structure to the flip-flops, the clock being represented as 284.

Within each of the flip-flops are transmission gates operated by the clock signal 252. As was discussed with reference to FIGS. 2 through 4, the scan enabling circuitry within the scan paths must be enabled prior to the latching of scan data from one flip-flop to another flip-flop. The time period in which the flip-flops' scan enabling circuitry becomes enabled is referred to as the scan data input setup time or "SDI setup time." Further, as was previously discussed, prior flip-flops requiring multiplexors in the flip-flops described with reference SDI setup times than do the flip-flops described with reference to FIGS. 2 through 4.

With reference to FIG. 9, in accordance with the present invention, each scan data path 282 has a length such that a transmission delay of the scan data path is at a minimum the scan path delay 258. The minimum scan path delay 258 is equal to the maximum clock skew rate 254. Further, the scan data path 282 has a maximum scan path delay 260. The maximum scan path delay 260 is equal to or less than the period of the system clock 252 minus the SDI set-up time 256. The requirement of the minimum scan path delay time 258 and the maximum scan path delay time 260 guarantees that data will not be smeared during operation and that the frequency of operation of the scan data portion of the integrated circuit will be at least as great as the frequency of operation of the integrated circuit during a system mode.

Thus, the scan data paths 282 may be designed at various differing lengths, as long as the minimum scan path delay 258 and maximum scan path delay 260 are satisfied. In this fashion, the benefits as described are provided.

Figure 11:
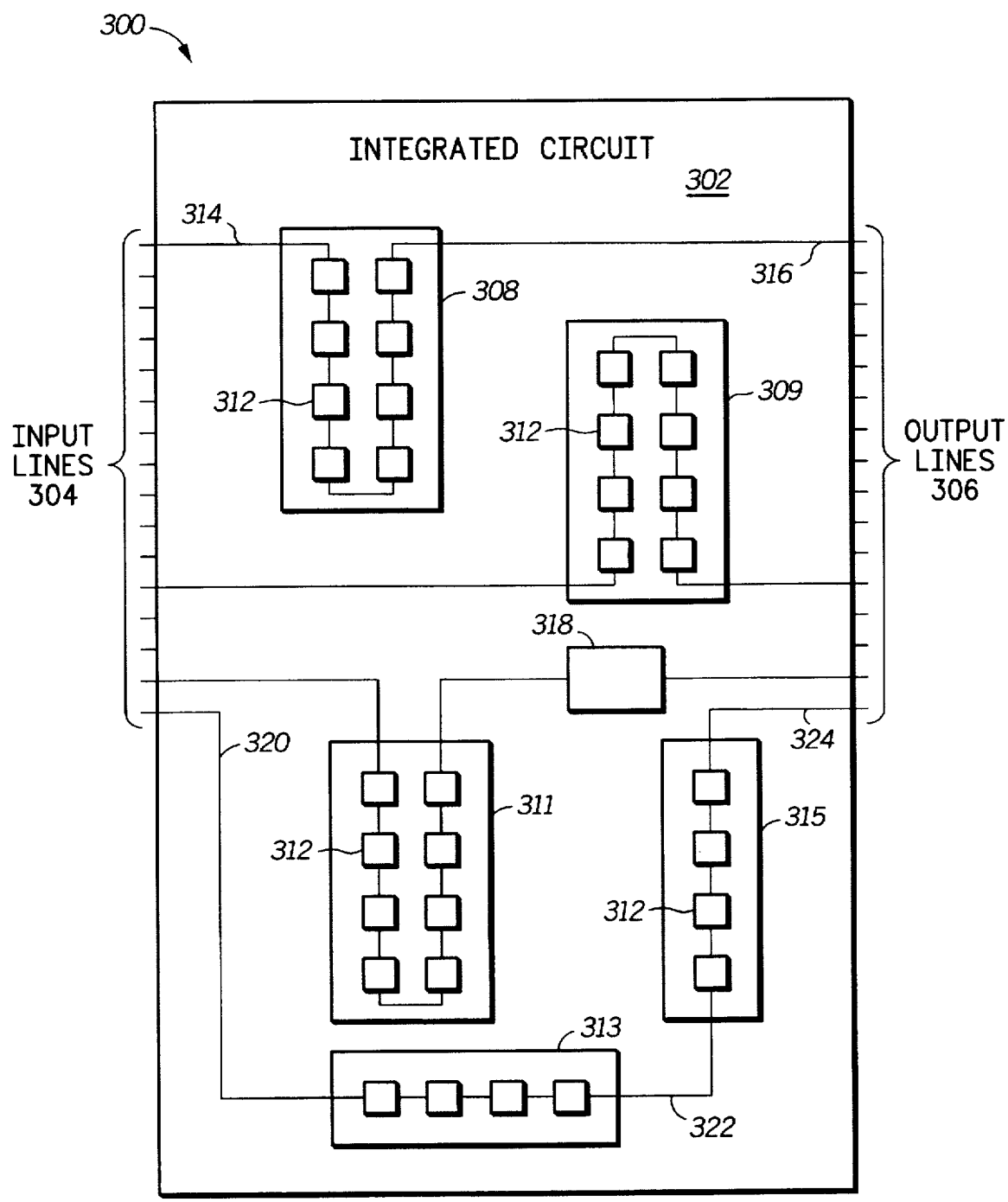
FIG. 11 is a block diagram illustrating a scan data testing structure in accordance with the present invention.

FIG. 11 illustrates a scan data testing structure 300 for providing scan data to a plurality of flip-flops 312 of an integrated circuit 302. The scan data testing structure comprises a plurality of input lines 304, a plurality of output lines 306 and a plurality of scan data paths 314, 316, 320, 322, and 324.

Each of the plurality of input lines 304 receive scan data signals. Each of the plurality of output lines 306 provides scan data signals as well. Preferably, a particular input line of the plurality of input lines 304 corresponds to a particular output line of the plurality of output lines 306. Thus, a tester using the structure described in conjunction with FIG. 11 may provide a series of scan data bits to one of the input lines 304 and receive an output at one of the output lines 306 based upon the input.

Each of the plurality of scan data paths operably couples to one of the plurality of input lines 304 and one of the plurality of output lines 306. Further, each of the plurality of scan data paths sequentially couples to a substantially equal number of flip-flops 312 so as to sequentially provide the scan data signals to the predetermined number of flip-flops. Further, each of the plurality of scan data paths has a substantially equal length. In this fashion, the scan data testing burden on each input line 304 is substantially equal so that a maximum testing rate may be achieved.

Input line 314 provides scan data to subsystem 308 in the integrated circuit 302. The scan data path 314 provides scan data to the eight flip-flops contained within the subsystem 308. The scan data is then provided to output line 316. Thus, a user of the scan data testing structure 300 illustrated in FIG. 11 could verify the operation of each of the eight flip-flops 312 within subsystem 308 by providing scan data to input line 314 and receiving the scan data via the output line 316. Further, as has been previously described, use of the scan data paths within the subsystem 308 of the integrated circuit 302 may be used to verify the logical operation of the logic paths providing input to each of the flip-flops 312 of subsystem 308.

Subsystem 309 may be tested in the same manner as subsystem 308 using the input line and output line connected to subsystem 309. As is shown with respect to subsystems 308 and subsystem 309, each of the subsystems includes eight flip-flops. Thus, there is an exactly equal number of flip-flops in each of the subsystems, each of the subsystems receiving input from a unique input line of the plurality of input lines 304. As one skilled in the art will readily appreciate, however, in a typical system incorporating the teachings illustrated in FIG. 11, many more than eight flip-flops would be coupled to each input line 304. However, for illustrative purposes, only eight flip-flops are shown coupled to each input line 304.

Subsystem 311 includes only seven flip-flops. Thus, in such a situation, the present invention may include adding an additional flip-flop to equalize the number of flip-flops coupled to the particular scan data path. The flip-flop may be a dummy flip-flop or may be from another subsystem, or may be a focused ion beam (FIB) cell which is a redundant cell on an IC that is selectively used to correct IC defects.

Further, with reference to subsystems 313 and 315, subsystems may be serially coupled to one another to further equalize the number of flip-flops associated with a particular input line 320 and output line 324. In this situation, connecting line 322 couples the subsystem 313 to subsystem 315.

Input lines 304 provide the dual purpose of providing input data to the integrated circuit as well as providing serial scan data to the integrated circuit. The input lines 304 are preferably multiplexed to provide the scan data and the system data to the flip-flops 312 within the integrated circuit 302. The multiplexing may occur in any mechanism known in the art such that the scan mode and system mode may be selectively enabled. At least some of the input lines 304 provide system data and scan data to a first flip-flop in the respective scan chain over separate data paths, the separate data paths extending from a multiplexor situated at the input line 304 port. However, in this fashion, there is no way to verify the delay time of the logical path between the input line of the plurality of input lines 304 and the first scan flip-flop in the scan chain.

Thus, in some situations it is preferable to use the same input path from one of the plurality of input lines 304 to a non-scan flip-flop which is the first flip-flop in the scan chain. In this fashion, the delay time of the path between the input line to the first flip-flop in the scan chain may be verified simply through varying the frequency of operation of the integrated circuit. The added complexity introduced by the logic circuitry preceding the first flip-flop in the scan chain may be easily compensated for by varying the scan data provided to the input lines 304.

Preferably, each of the flip-flops within the integrated circuit 302 illustrated in FIG. 11 operates on a single clock. The clock signal is distributed via conductive clock structure that provides a clock signal with a minimum skew.

Preferably also, the decisions to combine subsystems within a single scan data path will include considering the size of the subsystem, the location of the subsystem on the integrated circuit 302 so that the scan data paths of the integrated circuit may be further equalized and optimized. In this fashion, the scan mode testing requirements placed on each of the input lines 304 are substantially equal.

Thus, the scan data testing structure 300 illustrated in FIG. 11 provides the important benefit of further increasing the speed at which a complete integrated circuit 302 may be tested in the scan mode. Prior devices provided a single scan data input that would provide scan data to each flip-flop on a chip. However, the structure in FIG. 11 uses a plurality of input lines 304 to provide scan data to the flip-flops 312 within the integrated circuit 302. Another particular structure in addition to that shown in FIG. 11 includes using a common data path between the input lines 304 and a first flip-flop in the scan data path.

Figure 12:
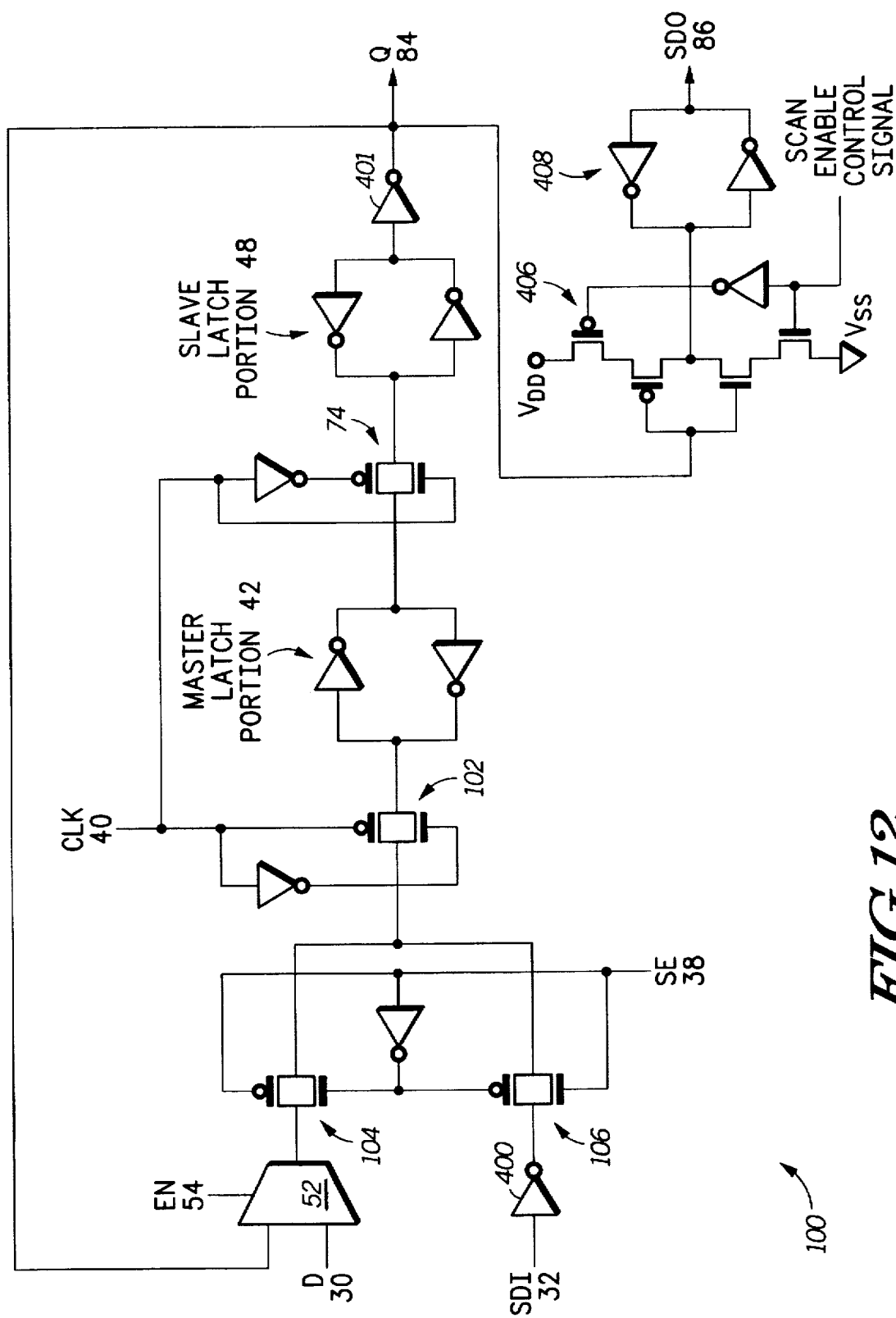
FIG. 12 is a block diagram illustrating an alternate scan data output configuration different from that illustrated in FIG. 4 and in accordance with the present invention.

FIG. 12 illustrates an alternative embodiment to provide for a low power scan data output solution. FIG. 12 illustrates many of the elements of FIG. 3 with identical reference numerals. New elements 406 is used to selectively decouple the SDO line 86 from the Q line 84 when in a normal mode of operation and is used to provide additional current drive. In addition, instead of using a resistor 112 as illustrated in FIG. 3, FIG. 12 uses a keeper circuit 408 (which is a circular coupled pair of inverters) to maintain a stable value on the SDO line 86 when in a normal mode of operation with the circuit 406 disconnecting the Q line 84 from the SDO line 86.

Further more, the scan chain flip-flops illustrated in FIGS. 3 and 4 can be formed as disconnected focused ion beam (FIB) cells which can be subsequently coupled via a FIB machines into a scan chain to either replace or supplement scan cells on the integrated circuit. If the flip flops cells are provided as FIB cells with no scan functionality, then insertion of a FIB cell into the scan line may render scan testing more difficult or impossible. Therefore, the use of scan cells as FIB cells is extremely important.

The above described preferred embodiments are intended to illustrate the principles of the invention, but not to limit the scope of the invention. For example, transfer gates can be changed in size to affect the set-up times of the SDI and D inputs. Various other embodiments and modifications to these preferred embodiments may be made by those skilled in the an without departing from the scope of the following claims.

What is claimed is:

1. A method for making a scannable integrated circuit, the method comprising the steps of:

forming a plurality of flip-flops on the scannable integrated circuit, wherein at least a portion of the plurality of flip-flops receive system data via system data transfer gates and serial scan data via scan data transfer gates;

coupling a clock signal to each of the plurality of flip-flops via a clock tree conductive structure, the clock tree conductive structure distributing the clock signal in a manner which allows flip-flops to be arranged on the scannable integrated circuit in a plurality of rows wherein each row contains a subset of flip-flops of the plurality of flip-flops;

coupling each flip-flop in a first row of the plurality of rows in series such that the serial scan data is provided to the first row of flip-flops in a serial manner in a first direction;

coupling each flip-flop in a second row of the plurality of rows in series such that serial scan data is provided to the second row of flip-flops in a serial manner in a second direction which is substantially opposite the first direction; and electrically coupling the first row to the second row so that the serial scan data is serially scanned through the first row and the second row in a serial manner to verify an operation of the flip-flops.

2. The method of claim 1, wherein the step of coupling each flip-flop in a first row further comprises inserting at least one driver in the first row.

3. The method of claim 1, wherein the step of coupling each flip-flop in a first row includes coupling adjacent flip-flops in the first row such that a propagation delay for serial scan data traveling between the adjacent flip-flops in the first row is less than a period of the clock signal minus a setup time of the flip-flops but greater than a maximum skew rate of the clock signal.

4. The method of claim 1, wherein the step of coupling a clock signal to each of the plurality of flip-flops via a clock tree conductive structure includes employing a clock tree conductive structure that provides the clock signal from a clock signal source point to each of the plurality of flip-flops over substantially equal propagation delay path lengths.

5. A method for making an integrated circuit comprising:

forming a plurality of scan chain devices on the integrated circuit, wherein at least a portion of the plurality of scan chain devices receive system data via system data transfer gates and serial scan data via scan data transfer gates;

coupling a plurality of system conductors to the plurality of scan chain devices that communicate the system data to and from the plurality of scan chain devices when in a non-scan mode of operation;

coupling a clock signal to each of the plurality of scan chain devices via a clock tree conductive structure; and coupling a plurality of scan conductors to the plurality of scan chain devices that communicate scan data to and from the plurality of scan chain devices when in a scan mode of operation, wherein a frequency of operation of the integrated circuit when in the scan mode of operation is greater than or equal to a frequency of operation of integrated circuit when in the non-scan mode of operation.

6. The method of claim 5, the step of coupling a clock signal to each of the plurality of scan chain devices via a dock tree conductive structure further comprises:

coupling the clock signal via a clock tree conductive structure that distributes the clock signal in a manner which allows the plurality of scan chain devices to be arranged on the integrated circuit in a plurality of rows, wherein each row contains a subset of scan chain devices of the plurality of scan chain devices.

7. The method of claim 6, wherein coupling the clock signal via a clock tree conductive structure includes employing a clock tree conductive structure that provides the clock signal from a clock signal source point to each of the plurality of flip-flops over substantially equal propagation delay path lengths.

8. The method of claim 5, wherein a frequency of operation of the integrated circuit when in the scan mode of operation is greater than or equal to 90 MHz.

9. The method of claim 5, wherein no conductors of the second plurality of conductors overlap each other.

10. The method of claim 5, wherein no portion of the clock tree conductive structure overlays any other portion of the clock tree conductive structure.

11. A method for routing signals in a scarmable integrated circuit, the method comprising:

routing a clock tree to each flip-flop in a multi-flip-flop scan chain formed on the scannable integrated circuit so that each flip-flop is supplied with a minimized skew clock signal;

routing a scan enable tree to each flip-flop in the multi-flip-flop scan chain, wherein the scan enable tree is substantially similar in structure to the clock tree such that the scan enable tree is in close proximity to the clock tree throughout substantial portions of the scannable integrated circuit;

routing a reset enable tree to each flip-flop in the multi-flip-flop scan chain, wherein the reset enable tree is substantially similar in structure to the clock tree such that the scan enable tree is in close proximity to the clock tree throughout substantial portions of the scarmable integrated circuit; and selectively grounding the scan enable tree and reset enable tree during a certain time period, wherein, when the scan enable tree and reset enable tree are grounded, the dock tree is shielded from noise by the scan enable tree and the reset enable tree due to the close proximity between the scan enable tree, the reset enable tree, and the dock tree.

12. A method for manufacturing a scannable integrated circuit, the method comprising:

forming a design file which contains a logical representation of a plurality of flip-flops, the plurality of flip-flops being interconnected through logic gates for forming, at least in part, the functional operational circuitry of the scannable integrated circuit;

accessing the design file via a place and route tool, the place and route tool arranging the plurality of flip-flops into a two-dimensional substrate area to form a physical design file of an integrated circuit die, wherein the integrated circuit die contains the plurality of flip-flops;

optimizing the design file so that the plurality of flip-flops are placed onto the integrated circuit die in a manner so that a non-scan mode of operation of the scannable integrated circuit is optimized;

after optimizing the design file, routing scan paths among the plurality of flip-flops in the scannable integrated circuit, wherein the scan paths serially shift scan data among the plurality of flip-flops during a scan mode of operation at a frequency greater than or equal to a frequency of operation of the scannable integrated circuit during the non-scan mode of operation, wherein each of the scan paths transmits serial scan data from a first flip-flop to a second flip-flop, and wherein a transmission delay time of each scan path is less than a period of a system clock minus a setup time of one of the flip-flops but greater than a maximum skew rate of the system clock; and manufacturing the integrated circuit die onto one or more physical substrates.

13. A scan data testing structure for providing serial scan data to a plurality of flip-flops of an integrated circuit, the scan data testing structure comprising:

a plurality of input lines, wherein each input line in the plurality of input lines receives serial scan data input signals;

a plurality of output lines, wherein each output line of the plurality of output lines provides serial scan data output signals; and a plurality of scan data paths, wherein each of the plurality of scan data paths operably couples to one of the plurality of input lines and one of the plurality of output lines, wherein each of the plurality of scan data paths sequentially couples to a substantially equal number of flip-flops so as to sequentially provide scan data signals to the plurality of flip-flops, wherein each of the plurality of scan data paths has a substantially equal length, and wherein a frequency of operation of the scan data paths is equal to or greater than a frequency of operation of the integrated circuit.

14. The scan data testing structure of claim 13, further comprising a clock tree conductive structure, wherein the clock tree conductive structure provides a system clock signal to each or the plurality of flip-flops of the integrated circuit.

15. The scan data testing structure of claim 13, further comprising at least one system data path segment that couples one of the plurality of input lines to a first flip-flop in a respective scan data path, wherein the at least one system data path segment provides system data to the first flip-flop, and wherein the at least one system data path segment coincides with a portion of the respective scan data path.

16. The scan data testing structure of claim 13, wherein a system data path segment couples system data from a first input line to a first flip-flop in a respective scan data path, and wherein a portion of the respective scan data path provides scan data from the first input line to the first flip-flop, and wherein a propagation delay of the system data path segment substantially equals a propagation delay of the portion of the respective scan data path.

17. The scan data testing structure of claim 13, wherein at least one scan data path of the plurality of scan data paths contains at least one driver within at least one scan data path.

18. The scan data testing structure of claim 13, further comprising a repeating flip-flop, wherein one of the scan data paths provides scan data to the repeating flip-flop so as to equalize the number of flip-flops coupled to the scan data path.

19. The scan data testing structure of claim 13, wherein one of the plurality of scan data paths further comprises optimized routing such that a propagation delay of the one of the plurality of scan data paths substantially equals a propagation delay of each of another scan data path in the plurality of scan data paths.

20. The scan data testing structure of claim 13, wherein the plurality of scan data paths includes a plurality of conductive structures, wherein no portion of the conductive structures overlays any other portion of the conductive structures.

21. The scan data testing structure of claim 13, wherein each of the plurality of scan data paths comprises connections to flip-flops in only a single subsystem of the integrated circuit, wherein the integrated circuit comprises a plurality of subsystems.

22. The scan data testing structure of claim 13, wherein each of the plurality of scan data paths couples to at least one subsystem of a plurality of subsystems in the integrated circuit, and wherein subsystem coupling of the plurality of scan data paths is optimized.

23. A method for manufacturing a scannable integrated circuit, the method comprising:

forming a focused ion beam (FIB) cell having a means for storing a binary value, a scan data input terminal, a functional data input terminal, a functional data output terminal, a clock input, a power input, and a ground input;

forming a first conductive region coupled to the power input to provide a power voltage;

forming a second conductive region coupled to the ground input to provide a ground voltage;

forming a third conductive region coupled to the clock input to provide a clock signal to the focused ion beam cell; and forming a fourth conductive region coupled to the scan data input such that the focused ion beam cell is coupled, via the scan data input, in a scan data path of the scannable integrated circuit but where the functional data input is not actively coupled to circuitry.

24. The method of claim 23 wherein the functional data input is coupled to active circuitry via a focused ion beam (FIB) machine.

25. The method of claim 23 wherein the functional data input is coupled to top conductive metal region wherein the top conductive metal region is used to form a focused ion beam (FIB) contact.

26. The method of claim 23 wherein the functional data output is coupled as a scan chain output.

27. The method of claim 23 wherein the functional data output is not actively coupled to circuitry and a scan data output is coupled as a scan chain output of the focused ion beam (FIB) cell.

28. The method of claim 23 wherein the functional data output is not actively coupled to circuitry and a scan data output is coupled as a scan chain output of the focused ion beam (FIB) cell.

29. A method for manufacturing a scannable integrated circuit, the method comprising:

forming a scan chain path within the integrated circuit wherein the scan chain path is a plurality of serially coupled flip-flops having a means for storing a binary value, a scan data input terminal, a scan data output terminal, a functional data input terminal, a functional data output terminal, a clock input, a power input, and a ground input;

forming a focused ion beam (FIB) cell in close proximity to the scan chain path, the focused ion beam (FIB) cell having a means for storing a binary value, a scan data input terminal, a scan data output terminal, a functional data input terminal, a functional data output terminal, a clock input, a power input, and a ground input;

forming a first conductive region coupled to the power input to provide a power voltage;

forming a second conductive region coupled to the ground input to provide a ground voltage;

forming a third conductive region coupled to the clock input to provide a clock signal to the focused ion beam cell; and electrically floating the scan data input, the scan data output, the functional data input, and the functional data output of the focused ion beam cell.

30. The method of claim 29 wherein the focused ion beam (FIB) cell is coupled into the scan chain path via a focused ion beam (FIB) machines.

31. The method of claim 29 wherein one of the scan data input, the scan data output, the functional data input, and the functional data output of the focused ion beam cell is coupled to either the power voltage or the ground voltage.

32. A scan data testing structure for providing serial scan data to a plurality of flip-flops of an integrated circuit, the scan data testing structure comprising:

a plurality of flip-flops positioned across a surface of an integrated circuit substrate, one flip-flop in the plurality of flip-flops comprising:

a feedback transfer gate directly coupled between an output of the one flip-flop and an input node to a master latch portion of the one flip-flop for placing the one flip-flop into a hold mode in response to a first control signal;

a data transfer gate directly coupled between a data line and the input node to the master latch portion of the one flip-flop for providing integrated circuit data to the master latch portion of the one flip-flop in response to a second control signal; and a scan transfer gate directly coupled between a scan input line and the input node to the master latch portion of the one flip-flop for providing scan test data to the master latch portion of the one flip-flop in response to a third control signal; and conductive interconnections connecting the plurality of flip-flops into a serial scan chain.

33. The method of claim 32 wherein the first, second, and third control signals are provided by a control circuit where the control circuit receives a scan enable signal, a clock enable signal, and another enable control signal and provides the first, second, and third control signals as output.

* * * * *

UNITED STATES PATENT AND TRADEMARK OFFICE
CERTIFICATE OF CORRECTION

PATENT NO. : 5,717,700
DATED : December 4, 1995
INVENTOR(S) : Alfred L. Crouch, et. al.

It is certified that error appears in the above-identified patent and that said Letters Patent is hereby corrected as shown below:

Column 19, line 9: Delete "dock", replace with -clock-

Signed and Sealed this

Twenty-ninth Day of September, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,717,700
DATED : February 10, 1998
INVENTOR(S) : Alfred L. Crouch et al.

It is certified that error(s) appear in the above-identified patent and that said Letters Patent is hereby corrected as shown below:

In Claim 11, Column 19, Line 30,
before "integrated", change "scarmable" to - -scannable- -.

In Claim 11, Column 19, Line 52,
before "tree", delete "dock", replace with - -clock- -.

Signed and Sealed this

Fifth Day of January, 1999

Attest:

Attesting Officer

Acting Commissioner of Patents and Trademarks